United States Patent
Pelley

(10) Patent No.: US 9,041,564 B2
(45) Date of Patent: May 26, 2015

(54) BUS SIGNAL ENCODED WITH DATA AND CLOCK SIGNALS

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 233 days.

(21) Appl. No.: 13/739,749

(22) Filed: Jan. 11, 2013

(65) Prior Publication Data

US 2014/0197976 A1 Jul. 17, 2014

(51) Int. Cl.
*H03M 5/16* (2006.01)
*H03M 5/02* (2006.01)

(52) U.S. Cl.
CPC ........................................ *H03M 5/02* (2013.01)

(58) Field of Classification Search
CPC . H03M 13/2957; H03M 13/256; H03M 5/02; H03M 13/2714
USPC ............................................... 341/50, 51, 57
See application file for complete search history.

(56) References Cited

U.S. PATENT DOCUMENTS

| 5,233,630 | A | * | 8/1993 | Wolf ............................... 375/308 |
|---|---|---|---|---|
| 5,942,995 | A | | 8/1999 | Hardy et al. |
| 6,084,537 | A | | 7/2000 | Hardy et al. |
| 7,089,467 | B2 | | 8/2006 | Burch |
| 8,023,602 | B2 | | 9/2011 | Choi |
| 8,121,200 | B2 | | 2/2012 | Zheng |
| 2004/0260542 | A1 | * | 12/2004 | Ananthapadmanabhan et al. ............................ 704/219 |
| 2011/0255585 | A1 | | 10/2011 | Lee |

OTHER PUBLICATIONS

Philippe, JM, et al., "A Low-Power and High-Speed Quaternary Interconnection Link using Efficient Converters", IEEE, Aug. 2005, pp. 4689-4692.
Rokhani, F.Z., et al., "Multi-level Signaling for Energy-Efficient On-Chip Interconnects", IEEE, Jul. 2007, pp. 82-85.

* cited by examiner

*Primary Examiner* — Jean B Jeanglaude

(57) ABSTRACT

A CODEC includes a transmission path between an encoder and a decoder. The encoder receives bits of data in a first form in which each bit of the data is represented by switching between first and second logic states and no voltage change between consecutive bits of the same logic state and serially transmits the bits in a second form in which the first logic state is maintained at a high voltage, the second logic state is maintained at a low voltage, and an intermediate voltage is maintained between consecutive bits. The decoder receives the bits in the second form and derives a clock from the occurrences of the intermediate voltage. The clock, repetitively, is maintained at a logic high, then switches directly from the logic high to a logic low, then is maintained at the logic low, and then switches directly between the logic low and the logic high.

20 Claims, 4 Drawing Sheets

BUS SIGNAL ENCODED WITH DATA AND CLOCK SIGNALS

BACKGROUND

1. Field

This disclosure relates generally encoding a clock with data to be transmitted.

2. Related Art

Many electronic systems send data with an associated bus clock signal such as bus in a microprocessor. These buses can be relatively long and includes data bit lines and a bus clock line, each having an inherent impedance and coupling to adjacent lines of the bus that affects the speed at which data and the bus clock are transmitted. These impedances can interact with data bit patterns transmitted on the data bit lines and thus the data and bus clock timing may become skewed by the time they reach the processor. Particularly with very high speed buses the skewing of the data relative to the bus clock can cause erroneous data latching and processing and thus such electronic systems compensate for skewing by selective insertion of discrete time delays inserted into the data bit lines and bus clock line.

Variations in the length of the bus, ambient surroundings, and permutations of the data bit patterns may require a system to identify a maximum skew range and then selectively include discrete delays to compensate for the maximum skew. However, some compensation methods identify the maximum skew range by use of unnecessarily large numbers of data bit patterns and typically require all possible data bit pattern permutations. In addition, some compensation methods attempt to identify the maximum skew range with single static patterns that do not adequately identify the extremities of the skew range.

BRIEF DESCRIPTION OF THE DRAWINGS

The present disclosure is illustrated by way of example, and not by way of limitation, in the figures of the accompanying drawings and in which like reference numerals refer to like elements and in which.

DETAILED DESCRIPTION

Generally, embodiments of the present disclosure, data and a locally generated clock signal are encoded in composite signal. The locally generated clock signal can be generated by dividing each bus clock signal into multiple clock signal pulses. The composite data/clock signal uses more than two voltage levels to distinguish between rising and falling edges of the clock signal pulses and the data. Embodiments disclosed herein can handle more data per wire, or reduce the number of wires required to handle a specified amount of data. Additionally, the data signals can be tracked precisely with the bus clock signals, avoiding skew problems associated with delays in long wire lengths.

Figure 1:
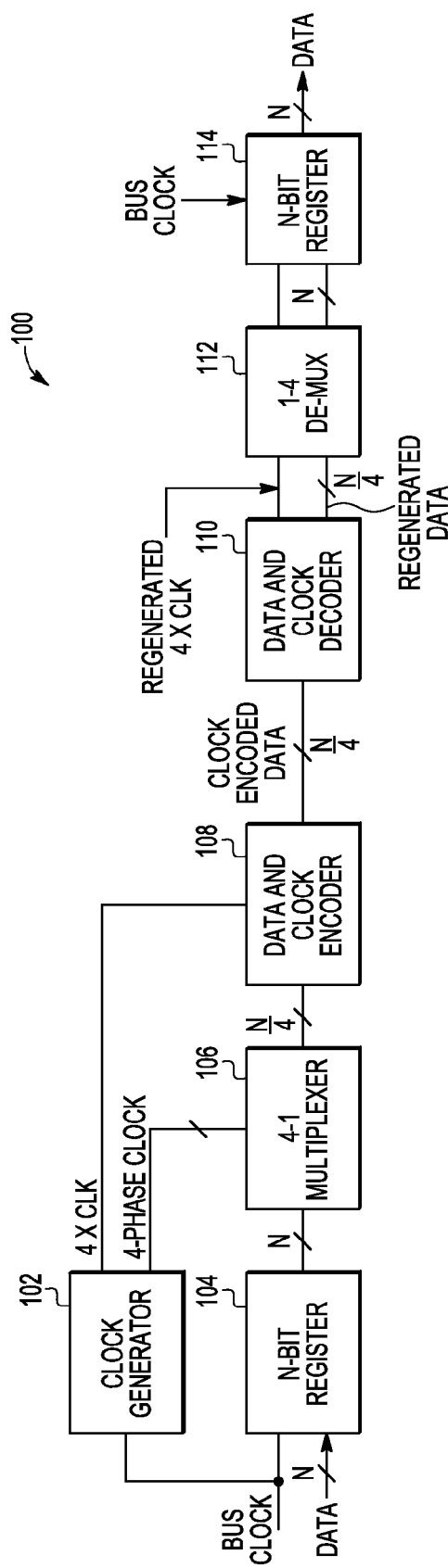
FIG. 1 illustrates, in block diagram form, an encoder/decoder in accordance with an embodiment of the present invention.

FIG. 1 illustrates, in block diagram form, an encoder/decoder (codec) 100 in accordance with an embodiment of the present invention that includes clock generator 102, N-bit register 104, a 4-1 multiplexer 106, data and clock encoder 108, data and clock decoder 110, 1-4 de-multiplexer 112, and N-bit register 114. Clock generator 102 receives a bus clock signal and outputs 4-phase clock signals to 4-1 multiplexer 106 and a 4XCLK signal to data and clock encoder 108. The 4-phase clock signals provided to multiplexer 106 are generated by dividing the bus clock cycle into four different clock signals distributed on separate wires, each with non-overlapping pulses. The 4XCLK signal that is input to data and clock encoder 108 is generated by multiplying the clock frequency by 4. Data and clock encoder 108 outputs clock encoded data on a transmission path.

Data signals are provided to N-bit register 104 on N-wires of the bus, which stores the N bits of the data signal using the bus clock signal. The data signal is provided to 4-1 multiplexer 106 on N wires. For each 4-phase clock signal, a data bit of the data signal is provided sequentially to data and clock encoder 108 on N/4 wires. The data and clock encoder 110 receives and decodes the sequential data bits on the N/4 wires off the transmission path producing a regenerated 4XCLK signal and sequential regenerated data from the encoded data bits. The 1-4 de-multiplexer 112 receives the sequential serial regenerated data and converts it into parallel regenerated data using the regenerated 4XCLK signal. The regenerated 4XCLK signal latches the parallel regenerated data into the N-bit register 114. The parallel regenerated data is retrieved from the N-bit register 114 using the bus clock signal. For example if N equals eight, the N-bit register 104 receives eight bits on eight wires and stores them in the N-bit register 104 using the bus clock. The registered bits are supplied to the 4-1 multiplexer 106 in parallel on eight wires. The multiplexer clocks out four data bits sequentially on each of two wires in data bursts using the 4-phase signal, resulting in a serial data burst on each wire at a four times higher frequency than the data coming into the N-bit register. Data and clock encoder 108 receives a four-bit sequential burst of data on each of the 2 wires and combines each of the sequential data burst bits with a respective portion of the 4XCLK signal to encode the clock and data into four composite sequential signals on a 2 wire data bus.

The two sequential data burst signals are transmitted as clock encoded data on the two data bus wires of the transmission path to the data and clock decoder 110 at the receiving end of the 2 wire bus. Data and clock decoder 110 separates the clock signals from the sequential data burst signals and provides the decoded sequential data burst signals and the regenerated 4XCLK signal to de-multiplexer 112 on two wires. Using the regenerated 4XCLK signal, de-multiplexer 112 parallelizes the sequential data bits of the data signal onto 8 wires which are clocked into N-bit register 114 using the regenerated 4XCLK signal. Data is retrieved from N-bit register 114 on eight wires using the bus clock.

Note that although N equals eight in the previous example, N can have any value that is a multiple of four such that data on N wires are encoded onto N/4 wires at one end of a data bus and the data on N/4 wires of that bus are decoded back to N wires. In other embodiments the four phase clock may have more or fewer number of phases, such as two or eight or sixteen phases and in those embodiments N may be any multiple of the number of phases of that embodiment.

Figure 2:
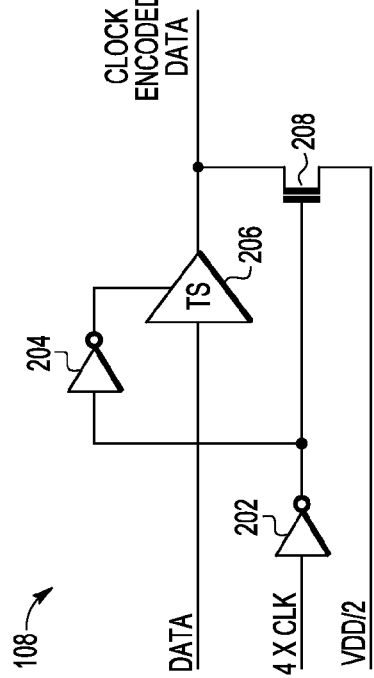
FIG. 2 illustrates, in schematic diagram form, an embodiment of an encoder of the codec of FIG. 1.

FIG. 2 illustrates, in schematic diagram form, an embodiment of encoder 108 of the codec 100 of FIG. 1. Encoder 108 includes inverter 202, inverter 204, tristate buffer 206, and N-channel transistor 208.

The input inverter 202 is coupled to the 4XCLK signal and the output of inverter 202 is coupled to the input of inverter 204 and to the gate of transistor 208. The output of inverter 204 is coupled as a control input to tristate buffer 206. The source of transistor 208 is coupled to VDD/2 and the drain is coupled to the output of tristate inverter 206. During first half of a cycle of the four phase clock when the 4XCLK signal and the output of inverter 204 are high, tristate buffer 206 outputs the data signal as a first part of the clock encoded data signal for that cycle. That is, during the first half cycle of the 4XCLK when the 4XCLK signal is high, either the data signal is high and in response the output of tristate buffer 206 is high or the data signal is low and in response the output of tristate buffer 206 is low. During the second half cycle of the inverted four phase clock the output of inverter 202 is high and the output of inverter 204 is low, both in response to the clock being low resulting in tristate buffer 206 entering a high impedance state. In the high impedance state tristate buffer 206 does not output data. Instead, the gate of N-channel transistor 208 is activated such that the current electrodes of transistor 208 couple VDD/2 to the clock encoded data signal as a second portion of the clock encoded data signal.

Figure 3:
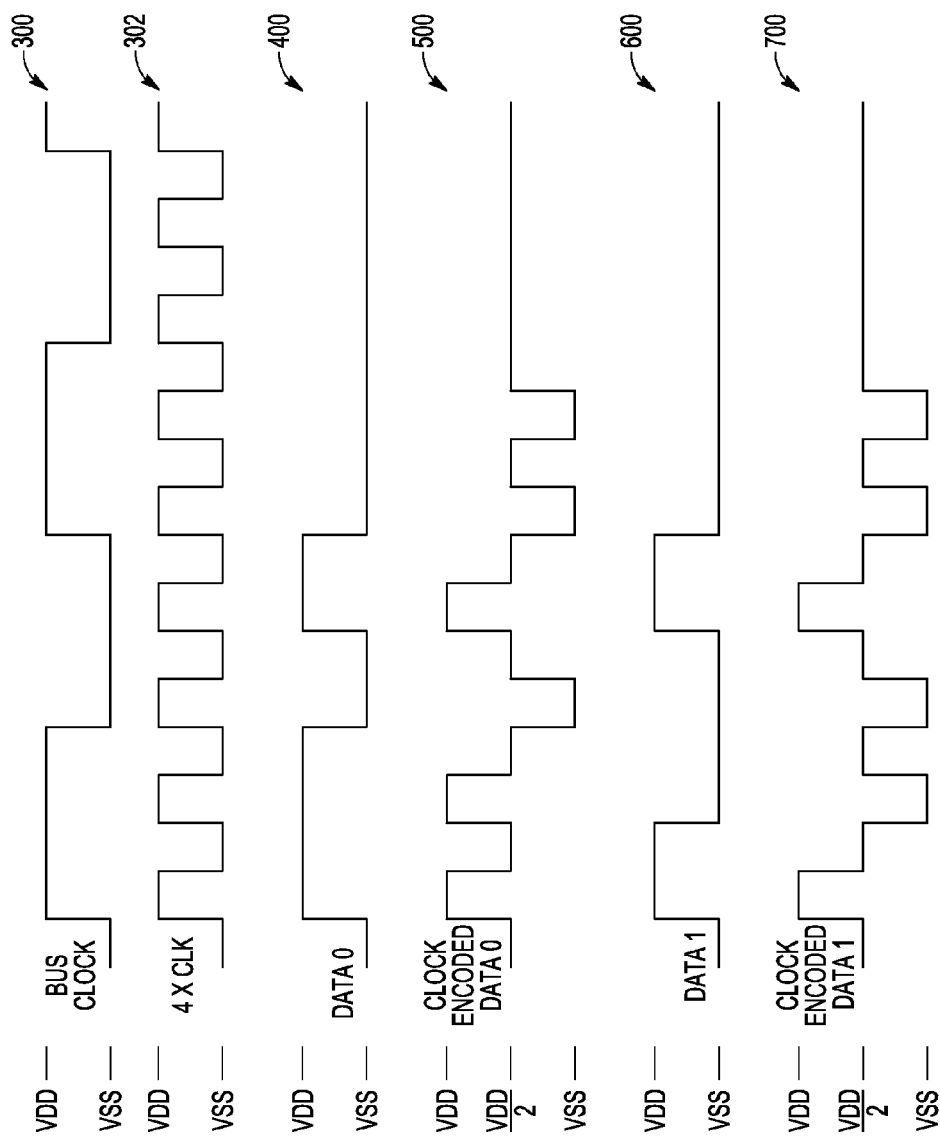
FIG. 3 illustrate timing diagrams of various signals of the encoder of FIG. 2 during operation.

FIG. 3 illustrates timing diagrams of various signals of the encoder 108 of FIG. 2 during operation. The 4XCLK signal 302 alternates between VSS and VDD four times every bus clock cycle 300. DATA0 signal 400 and corresponding clock encoded data0 signal 500 provide a first example of a first data input signal and corresponding clock encoded data signal associated with clock signals 300, 302. DATA1 signal 600 and corresponding clock encoded DATA1 signal 700 show a second example of a second data input signal and corresponding clock encoded data signal associated with clock signals 300, 302.

In the first example, input DATA0 signal 400 is at VDD for the first two cycles of the 4XCLK signal, at VSS for the next cycle of the 4XCLK signal 302, at VDD for the subsequent cycle of the 4XCLK signal 302, and at VSS thereafter. In the second example, data input signal DATA1 signal 600 is high for the first cycle of the 4XCLK signal 302, low for the next two cycles of the 4XCLK signal 302, high for the subsequent cycle of the 4XCLK signal 302 and low thereafter.

In response to 4XCLK signal 302 and DATA0 signal 400, clock encoded DATA0 signal 500 is at voltage level VSS when the 4XCLK signal 302 is at VDD and the DATA0 signal 500 is at VSS. When the 4XCLK signal 302 is at VDD and the DATA0 signal 400 is at VDD, the clock encoded DATA0 signal 500 is at VDD. When the 4XCLK signal is at VSS the clock encoded DATA0 signal 500 is at VDD/2 regardless of the voltage of the data signal.

The use of three different voltage levels to represent data encoded with a clock signal allows the clock signal to be embedded in the data signal and transmitted to a decoder 110 (FIG. 1) at the destination, where the data signals are separated from the clock signals. The ability to transmit the clock and data signals together avoids skewing the data with respect to the clock signals over relatively long bus lines where individual signal wires are subject to data dependant cross coupling. Precise clock and data tracking allows much higher data rates over each of the wires of a bus.

Figure 4:
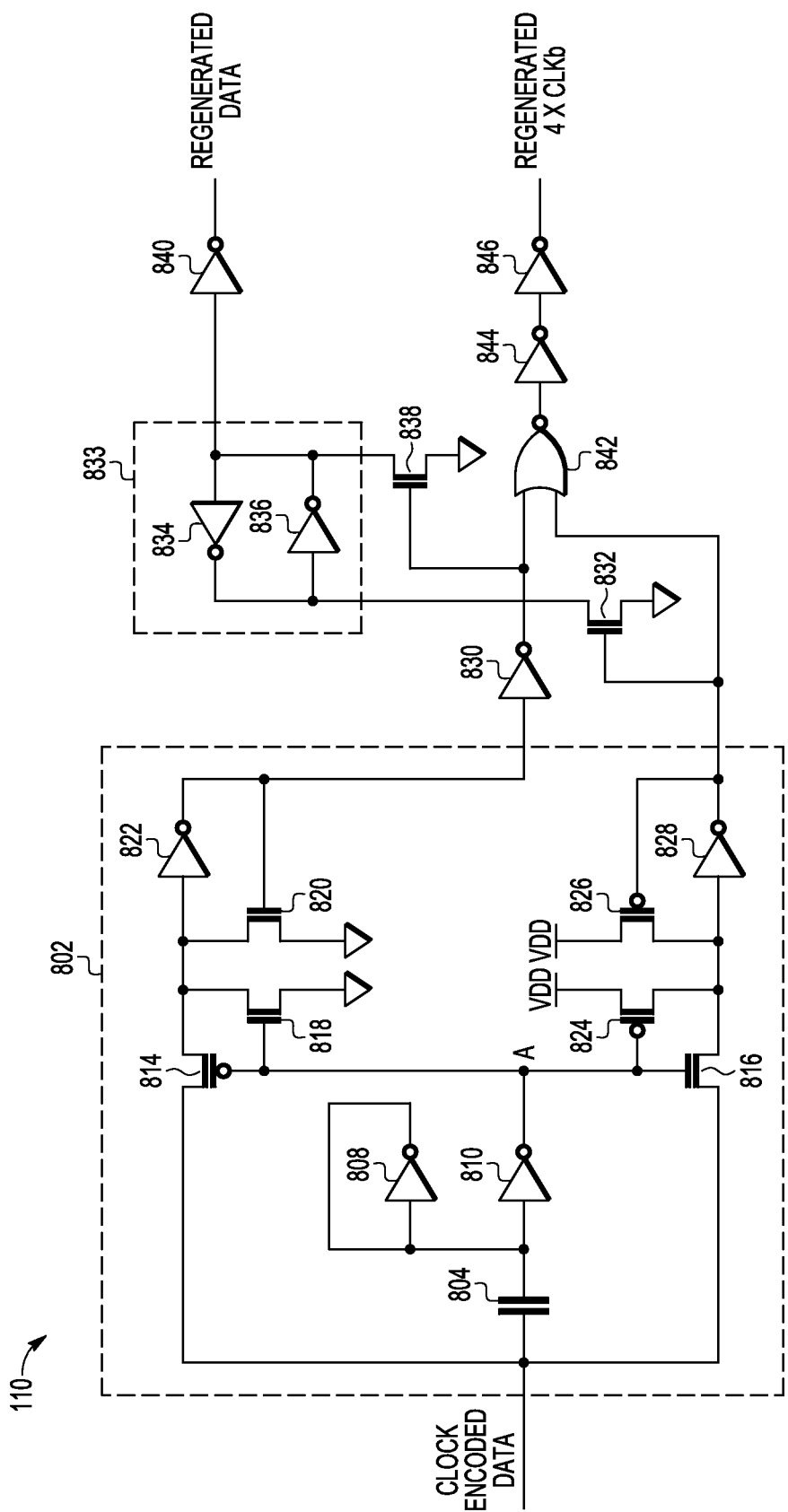
FIG. 4 illustrates, in schematic diagram form, an embodiment of a decoder of the codec of FIG. 1.

FIG. 4 illustrates, in schematic diagram form, an embodiment of a decoder 110 of the codec 100 of FIG. 1 including data regenerator 802 and additional circuitry for generating the 4XCLK signal and latching the regenerated data for output. Data regenerator 802 includes a capacitor 804 with an input coupled to a clock encoded data signal and an output coupled to the inputs of inverters 808 and 810. The input of inverter 808 is coupled to its output to bias the output of capacitor 804.

The clock encoded data signal is also coupled to the source electrodes of P-channel transistor 814 and N-channel transistor 816. The gate electrode of P-channel transistors 814 and 824 and the gate electrode of N-channel transistors 816 and 818 are coupled to the output of inverter 810 which is labeled node A in FIG. 4.

The drain electrode of P-channel transistor 814 is coupled to drain electrodes of N-channel transistors 818, 820. The drain electrode of N-channel transistor 816 is coupled to drain electrodes of P-channel transistors 824, 826. The source electrodes of N-channel transistors 818, 820 are coupled to VSS. The source electrodes of P-channel transistors 824, 826 are coupled to a supply voltage VDD.

The input to inverter 822 is coupled to the drain electrode of P-channel transistor 814. The output of inverter 822 is coupled to the gate electrode of N-channel transistor 820 and the input of inverter 830. The output of inverter 830 is coupled to a first input of NOR gate 842 and a gate electrode of N-channel transistor 838. Latch circuit 833 comprises inverters 834 and 836. The output of inverter 836 is coupled to an input of inverter 834 and the output of latch 833, and the output of inverter 834 coupled to the input of inverter 836. The drain electrode of N-channel transistor 838 is coupled to the output of latch circuit 833. The source electrode of N-channel transistor 838 is coupled to VSS. The output of latch circuit 833 is coupled as input to inverter 840. The output of inverter 840 is the REGENERATED DATA SIGNAL.

Input to inverter 828 is coupled to the drain electrode of N-channel transistor 816. Output of inverter 828 is coupled to a gate electrode of N-channel transistor 832, a gate electrode of P-channel transistor 826, and to a second input of NOR gate 842. The source electrode of N-channel transistor 832 is coupled to VSS and the drain electrode of N-channel transistor 832 is coupled to the input of inverter 836 and the output of inverter 834 of the latch circuit 833. The output of NOR gate 842 is coupled as input to inverter 844. Output from inverter 844 is coupled as input to another inverter 846. The output from inverter 846 is a regenerated 4XCLKb signal.

The transistors of inverters 808 and the transistors of inverter 810 are ratioed such that the inputs and outputs of inverters 810 and 808 are biased to approximately ½ VDD when the CLOCK ENCODED DATA signal is quiescent.

Figure 5:
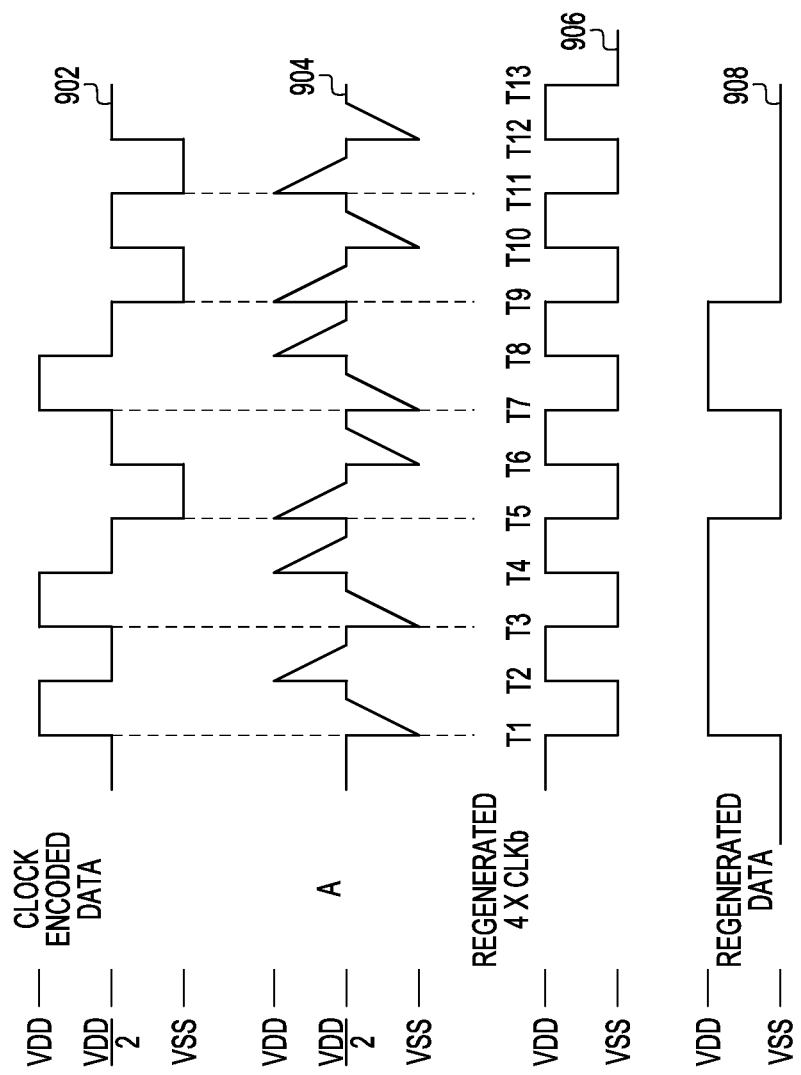
FIG. 5 illustrates timing diagrams of various signals of the decoder of FIG. 4 during operation.

FIG. 5 illustrates timing diagrams of various signals of the decoder of FIG. 4 during operation. The operation of decoder 110 will now be described with reference to FIGS. 4 and 5.

The input signal to the decoder 110 of the codec 100 of FIG. 1 is the clock encoded data signal shown as signal 902 in FIG. 5. Transistors 824 and 816 are sized so that the drain of transistor 816 can only be switched to VSS if the gate of transistor 816 is at VDD and the source of transistor is at VSS. In a similar fashion, transistors 814 and 820 are sized so that the drain of transistor 814 can only be switched to VDD if the gate of transistor 816 is at VSS and the source of transistor 814 is at VDD. That is, when the clock encoded data signal is at VDD/2, the drain of transistor 814 cannot be pulled high and the drain of transistor 816 cannot be pulled low regardless of the voltage of the signal on node A. The signal on node A as it responds to the clock encoded data 902 is shown as signal 904 in FIG. 5.

The drain of transistor 814 is coupled to VSS when the signal 908 on node A is at VDD. The signal on the drain of transistor 816 is coupled to VDD when the signal at node A is at VSS. As shown in FIG. 5 the signal 904 at node A is coupled to VSS in response the rising edge of clock encoded data signal 906 coupled through capacitor 804 and inverter 810, coupled to VDD by the falling edge of clock encoded data signal 906 coupled through capacitor 804 and inverter 810. In response to each transition of the signal 908 of node A to VDD, transistor 818 discharges the input of inverter 822 to VSS.

In response to each transition of Node A to VSS, transistor 824 couples the input of inverter to 828 to VDD. After each transition of the input and output of the capacitor 804 to VDD or VSS the output of the inverter 810, the signal 904 at node A, is returned to VDD/2 as inverter 808 discharges the output of capacitor 804 to VDD/2.

Inverter 822 couples to the gate of transistor 820 for transistor 820 to add hysteresis to the signal at the input of inverter 822 to make it more difficult to switch the signal at the input of inverter 822 to VSS. Likewise inverter 828 couples the gate of transistor 826 for transistor 826 to add hysteresis to the signal at the input of inverter 826 to make it more difficult to switch the signal at the input of inverter 822 to VDD. The hysteresis effect ensures that that no signal is passed through transistors 814 and 816 unless their respective sources are at VDD or VSS, regardless of the signal voltage at node A.

When the clock encoded data signal transitions to VDD, inverters 822 and 830 provide a logic high (VDD) at the gate of transistor 838 causing the drain of transistor 838 to pull the output of latch circuit 833 low. Inverter 828 provides a logic high to the gate of transistor 832 when the input of inverter 828 is low in response to the clock encoded data signal transitioning to VSS resulting in the node at the output of inverter 834 to be pulled low and the output of latch circuit 833 to be coupled high. N-channel transistors 838 and 832 are stronger than the P-channel devices of inverters 834 and 836 allowing the transistors 838 and 832 to switch the state of latch circuit 833. The output of inverter 840 drives the regenerated data signal. An example of the regenerated data signal 908 is shown in FIG. 5.

When the clock encoded data signal transitions to VDD/2, the logic high on the input of NOR gate 842 is set to a logic low, so that both inputs to NOR gate 842 are low. When inputs to NOR gate 842 are both low, the output of NOR gate 842 is high, the output of inverter 844 is low, thereby setting the output of inverter 846, the regenerated 4XCLKb signal 906 (FIG. 5), high. The logical result of clock encoded data signal transitioning to VDD or VSS is a corresponding one of the inputs of the NOR gate 830 going high. In response to an input of NOR gate 842 going high, a regenerated 4XCLK signal at a logic low is provided at the output inverter 846. Inverters 840, 844, 846, are designed to establish a relative delay between the regenerated 4XCLK signal and the regenerated data signal so that the regenerated data signal is stable by the time the regenerated 4XCLK signal transitions to a logic low. The falling edge of the regenerated 4XCLK signal is used to latch the regenerated data signal into the N-bit register 114 of FIG. 1.

In some embodiments, different set of voltages for the encoded data bits may be used, for example VDD, VSS, and −VDD.

By now it should be appreciated that, in some embodiments, a codec can comprise a data and clock encoder 108 that receives bits of data in a first form 400 in which each bit of the data is represented by one of a first logic state and a second logic state. The encoder transmits the bits of data serially in a second form 500 in which the first logic state of a bit is represented by maintaining a high voltage and the second logic state of a bit is represented by maintaining a low voltage and an intermediate voltage is maintained between adjacent bits of the bits of data transmitted serially. A transmission path is coupled to the data and clock encoder that transmits the bits of data in the second form. A data and clock decoder 110 coupled to the transmission path receives the bits of data transmitted in the second form and derives a clock from the intermediate voltage that is maintained between adjacent bits that repetitively is maintained at a logic high, then switches directly from the logic high to a logic low, then is maintained at the logic low, and then switches directly between the logic low and the logic high.

In another aspect, the data and clock decoder can be further characterized as converting the bits of data transmitted serially to sequential bits in which the sequential bits are adjacent so that a voltage level is maintained when adjacent bits are the same logic state and the voltage level is changed when adjacent bits have a different logic state.

In another aspect, the sequential bits can have a data rate and the clock has a clock rate, wherein the clock rate and the data rate are the same and the data and clock encoder, the transmission path, and the data and clock decoder are on the same integrated circuit 100.

In another aspect, the codec can further comprise a register 104 having a plurality of data outputs, and a multiplexer 106 having inputs coupled to the plurality of outputs of the register 104 and an output coupled to the data and clock encoder. The multiplexer 106 provides the bits of data to the data and clock encoder as a result of multiplexing the plurality of outputs of the register 104.

In another aspect, the codec can further comprise a de-multiplexer 114 coupled to the data and clock decoder. The de-multiplexer 114 separates the sequential bits into a plurality of data streams corresponding to the plurality of data outputs of the register 104.

In another aspect, the data and clock encoder can comprise a first inverter 202 having an input for receiving an input clock and an output, a second inverter 204 having an input coupled to the output of the first inverter 202 and an output, a tristate driver with a control input coupled to the input of the second inverter 204, an input for receiving the bits of data, and an output coupled to the transmission path, and a transistor having a control electrode coupled to the output of the first inverter 202, a first current electrode coupled to an intermediate power supply terminal that has an output at a voltage level equal to the intermediate voltage level, and a second current electrode coupled to the output of the third inverter.

In another aspect, the data and clock decoder can comprise a data regenerator having an input coupled to the transmission path, a first output, and a second output; and a separator circuit 833, 842 for generating the clock and providing sequential bits representative of the bits of data in response to the first output and the second output.

In another aspect, the data regenerator can comprise a capacitor 804 having a first terminal coupled to the transmission path and a second terminal, an inverter 810 having an input coupled to second terminal of the capacitor and an output, and a bias circuit 808 coupled to the input of the inverter for biasing the input of the inverter to a voltage between the high voltage and the low voltage. A first transmission gate 814 has a complementary input coupled to the output of the inverter, a first terminal coupled to the transmission path, and a second terminal coupled to the first output of the data regenerator. A second transmission gate 816 has a true input coupled to the output of the inverter, a first terminal coupled to the transmission path, and a second terminal coupled to the second output of the regenerator circuit.

In another aspect, the separator circuit 833, 842 can comprise a latch 834, 836 circuit coupled to the first and second outputs of the regenerator circuit that provides the sequential bits in which the sequential bits are adjacent so that a voltage level is maintained when adjacent bits are the same logic state and the voltage level is changed when adjacent bits have a different logic state, and a NOR gate coupled to the first and second outputs of the regenerator circuit, wherein the NOR gate outputs a clock signal.

In another aspect, the regenerator can further comprise a detector inverter 822 (822), the detector inverter 822 is used to couple the second terminal of the first transmission gate to first output of the regenerator, wherein the detector inverter 822 has an input coupled to the second terminal of the first transmission gate and an output coupled to the first output of the regenerator circuit.

In other embodiments, a method of operating a codec in transmitting data across a transmission path of the codec can comprise formatting sequential bits of data from a first form 400 in which each bit of the data is represented by one of a first logic state and a second logic state to a form 500 in which the first logic state of a bit is represented by maintaining a high voltage and the second logic state of a bit is represented by maintaining a low voltage and an intermediate voltage is maintained between adjacent bits of the bits of data. The bits of data are transmitted in the second form across the transmission path, and the bits of data transmitted in the second form are received, a clock from the intermediate voltage is derived that is maintained between adjacent bits.

In another aspect, the method can further comprise after transmitting the bits of data, converting the bits of data to sequential bits into received sequential bits the first form.

In another aspect, the received sequential bits have a data rate and the clock has a clock rate, wherein the clock rate and the data rate are the same.

In another aspect, the method can further comprise providing a plurality of data outputs in the first form.

In another aspect, in the formatting the bits in the first form, adjacent bits at the same logic state in the first form have no change in voltage between the adjacent bits.

In other embodiments, a codec 108 can comprise an encoder that receives bits in a first form 400 of one of a first logic state and a second logic state in which no transition in voltage occurs between consecutive bits when the consecutive bits are both of the first logic state or of the second logic state and has an output that provides the bits in a second form 500 in which an intermediate voltage is maintained between consecutive bits that is intermediate a voltage of the first logic state and a voltage of the second logic state. A transmission path has a first end coupled to the output of the encoder. The transmission path has a second end. A decoder 110 is coupled to the second end that generates a regenerated clock responsive to occurrences of the intermediate voltage.

In another aspect, the decoder can be further characterized as providing a serial data stream synchronized with the recovered clock.

In another aspect, in the second form, the first logic state is a positive voltage, the second logic state is a negative voltage, and the intermediate voltage is ground.

In another aspect, in the second form, the first logic state is a positive voltage, the second logic state is a ground, and the intermediate voltage is approximately ½ VDD.

In another aspect, the decoder can further include a register 104 having a plurality of data outputs, and a multiplexer 106 having inputs coupled to the plurality of outputs of the register 104 and an output coupled to the encoder. The multiplexer 106 provides the bits of data to the encoder as a result of multiplexing the plurality of outputs of the register 104.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A codec, comprising:
   a data and clock encoder that receives bits of data in a first form in which each bit of the data is represented by one of a first logic state and a second logic state and transmits the bits of data serially in a second form in which the first logic state of a bit is represented by maintaining a high voltage and the second logic state of a bit is represented by maintaining a low voltage and an intermediate voltage is maintained between adjacent bits of the bits of data transmitted serially;
   a transmission path coupled to the data and clock encoder that transmits the bits of data in the second form; and
   a data and clock decoder coupled to the transmission path that receives the bits of data transmitted in the second form and derives a clock from the intermediate voltage that is maintained between adjacent bits that repetitively:
      is maintained at a logic high;
      then switches directly from the logic high to a logic low, then is maintained at the logic low; and
then switches directly between the logic low and the logic high.

2. The codec of claim 1, wherein the data and clock decoder is further characterized as converting the bits of data transmitted serially to sequential bits in which the sequential bits are adjacent so that a voltage level is maintained when adjacent bits are the same logic state and the voltage level is changed when adjacent bits have a different logic state.

3. The codec of claim 2, wherein the sequential bits have a data rate and the clock has a clock rate, wherein the clock rate and the data rate are the same and the data and clock encoder, the transmission path, and the data and clock decoder are on the same integrated circuit.

4. The codec of claim 2 further comprising:
a register having a plurality of data outputs;
a multiplexer having inputs coupled to the plurality of outputs of the register and an output coupled to the data and clock encoder,
wherein:
the multiplexer provides the bits of data to the data and clock encoder as a result of multiplexing the plurality of outputs of the register.

5. The codec of claim 4, further comprising a demultiplexer coupled to the data and clock decoder, wherein the demultiplexer separates the sequential bits into a plurality of data streams corresponding to the plurality of data outputs of the register.

6. The codec of claim 1, wherein the data and clock encoder comprises:
a first inverter having an input for receiving an input clock and an output;
a second inverter having an input coupled to the output of the first inverter and an output;
a tristate driver with a control input coupled to the input of the second inverter, an input for receiving the bits of data, and an output coupled to the transmission path; and
a transistor having a control electrode coupled to the output of the first inverter, a first current electrode coupled to an intermediate power supply terminal that has an output at a voltage level equal to the intermediate voltage level, and a second current electrode coupled to the output of the third inverter.

7. The codec of claim 1, wherein the data and clock decoder comprises:
a data regenerator having an input coupled to the transmission path, a first output, and a second output; and
a separator circuit for generating the clock and providing sequential bits representative of the bits of data in response to the first output and the second output.

8. The codec of claim 7, wherein the data regenerator comprises:
a capacitor having a first terminal coupled to the transmission path and a second terminal;
an inverter having an input coupled to second terminal of the capacitor and an output;
a bias circuit coupled to the input of the inverter for biasing the input of the inverter to a voltage between the high voltage and the low voltage;
a first transmission gate having a complementary input coupled to the output of the inverter, a first terminal coupled to the transmission path, and a second terminal coupled to the first output of the data regenerator; and
a second transmission gate having a true input coupled to the output of the inverter, a first terminal coupled to the transmission path, and a second terminal coupled to the second output of the regenerator circuit.

9. The codec of claim 7, wherein the separator circuit comprises:
a latch circuit coupled to the first and second outputs of the regenerator circuit that provides the sequential bits in which the sequential bits are adjacent so that a voltage level is maintained when adjacent bits are the same logic state and the voltage level is changed when adjacent bits have a different logic state; and
a NOR gate coupled to the first and second outputs of the regenerator circuit, wherein the NOR gate outputs a clock signal.

10. The codec of claim 8, wherein the regenerator further comprises a detector inverter (822), the detector inverter is used to couple the second terminal of the first transmission gate to first output of the regenerator, wherein the detector inverter has an input coupled to the second terminal of the first transmission gate and an output coupled to the first output of the regenerator circuit.

11. A method of operating a codec in transmitting data across a transmission path of the codec, comprising:
formatting sequential bits of data from a first form in which each bit of the data is represented by one of a first logic state and a second logic state to a form in which the first logic state of a bit is represented by maintaining a high voltage and the second logic state of a bit is represented by maintaining a low voltage and an intermediate voltage is maintained between adjacent bits of the bits of data;
transmitting the bits of data in the second form across the transmission path; and
receiving the bits of data transmitted in the second form; and
deriving a clock from the intermediate voltage that is maintained between adjacent bits.

12. The method of claim 11, further comprising, after transmitting the bits of data, converting the bits of data to sequential bits into received sequential bits the first form.

13. The method of claim 12, wherein the received sequential bits have a data rate and the clock has a clock rate, wherein the clock rate and the data rate are the same.

14. The method of claim 11, further comprising providing a plurality of data outputs in the first form.

15. The method of claim 11, whereby, in the formatting the bits in the first form, adjacent bits at the same logic state in the first form have no change in voltage between the adjacent bits.

16. A codec, comprising:
an encoder that receives bits in a first form of one of a first logic state and a second logic state in which no transition in voltage occurs between consecutive bits when the consecutive bits are both of the first logic state or of the second logic state and has an output that provides the bits in a second form in which an intermediate voltage is maintained between consecutive bits that is intermediate a voltage of the first logic state and a voltage of the second logic state;
a transmission path having a first end coupled to the output of the encoder, wherein the transmission path has a second end;
a decoder coupled to the second end that generates a regenerated clock responsive to occurrences of the intermediate voltage.

17. The codec of claim 16, wherein the decoder is further characterized as providing a serial data stream synchronized with the recovered clock.

18. The method of claim 16, wherein, in the second form, the first logic state is a positive voltage, the second logic state is a negative voltage, and the intermediate voltage is ground.

19. The method of claim 16, wherein, in the second form, the first logic state is a positive voltage, the second logic state is a ground, and the intermediate voltage is approximately ½ VDD.

20. The codec of claim 16 further comprising:
a register having a plurality of data outputs;
a multiplexer having inputs coupled to the plurality of outputs of the register and an output coupled to the encoder,
wherein:
the multiplexer provides the bits of data to the encoder as a result of multiplexing the plurality of outputs of the register.

* * * * *